(12) United States Patent
Hooper et al.

(10) Patent No.: US 7,632,698 B2
(45) Date of Patent: Dec. 15, 2009

(54) INTEGRATED CIRCUIT ENCAPSULATION AND METHOD THEREFOR

(75) Inventors: Stephen R. Hooper, Mesa, AZ (US); David E. Heeley, Glendale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 422 days.

(21) Appl. No.: 11/383,649

(22) Filed: May 16, 2006

(65) Prior Publication Data

US 2007/0269933 A1   Nov. 22, 2007

(51) Int. Cl.
*H01L 21/00* (2006.01)

(52) U.S. Cl. .............................. 438/51; 438/50; 438/53; 257/E21.502

(58) Field of Classification Search ..................... 438/51
See application file for complete search history.

(56) References Cited

U.S. PATENT DOCUMENTS

| 4,059,708 | A | 11/1977 | Heiss, Jr. et al. |
| 5,585,669 | A | 12/1996 | Venambre |
| 5,897,338 | A * | 4/1999 | Kaldenberg .................. 438/116 |
| 6,379,988 | B1 * | 4/2002 | Peterson et al. ................ 438/51 |
| 6,395,858 | B1 * | 5/2002 | Mack et al. .................... 528/38 |
| 6,401,545 | B1 | 6/2002 | Monk et al. |
| 6,420,201 | B1 * | 7/2002 | Webster ........................ 438/51 |
| 6,441,503 | B1 | 8/2002 | Webster |
| 6,876,090 | B2 | 4/2005 | Mensch et al. |
| 7,014,888 | B2 * | 3/2006 | McDonald et al. ........... 427/558 |
| 7,109,055 | B2 * | 9/2006 | McDonald et al. ............. 438/51 |
| 7,192,798 | B2 * | 3/2007 | Okada et al. ................... 438/51 |
| 7,235,431 | B2 * | 6/2007 | Wood et al. .................. 438/125 |
| 7,273,767 | B2 * | 9/2007 | Ong et al. .................... 438/113 |
| 7,462,919 | B2 * | 12/2008 | Engling et al. ............... 257/419 |
| 2004/0118214 | A1 | 6/2004 | McDonald et al. |

* cited by examiner

*Primary Examiner*—David A Zarneke
(74) *Attorney, Agent, or Firm*—Susan C. Hill

(57) ABSTRACT

A device (12) may have a pressure sensitive portion (17) which is protected from corrosion by a pressure transmitting material (20). Pressure transmitting material (20) may also be used to transmit pressure to pressure sensitive portion (17). A masking material (22) may be used to define an opening (26) in encapsulating material (24).

14 Claims, 2 Drawing Sheets

INTEGRATED CIRCUIT ENCAPSULATION AND METHOD THEREFOR

RELATED APPLICATION

This is related to U.S. patent application Ser. No. 11/039,688 filed on Jan. 20, 2005, entitled "METHODS AND APPARATUS HAVING WAFER LEVEL CHIP SCALE PACKAGE FOR SENSING ELEMENTS", which is assigned to the current assignee hereof, and which is hereby incorporated by reference.

FIELD OF THE INVENTION

The present invention relates generally to integrated circuits, and more particularly to encapsulation for integrated circuits.

RELATED ART

Reliability may become an issue for integrated circuits (ICs) that are used in hostile environments (e.g. where an IC is exposed to corrosive chemicals). Better methods for packaging ICs to protect the ICs when they are used in hostile environments is desirable.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
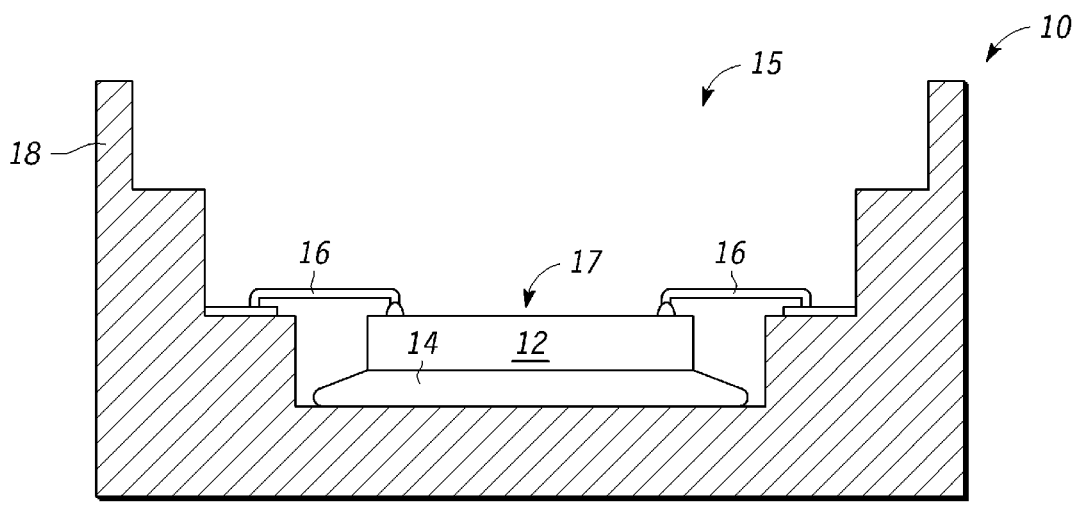
FIGS. 1-6 illustrate cross-sectional views of an apparatus and encapsulation method in accordance with one embodiment of the present invention.

FIG. 1 illustrates a cross-sectional view of an apparatus 10 and a portion of an encapsulation method in accordance with one embodiment of the present invention. In alternate embodiments, apparatus 10 may have other or additional functions.

In the illustrated embodiment, device 12 is an integrated circuit that functions as a pressure sensor. In alternate embodiments, device 12 may be any type of sensor, IC, or circuitry that serves any type of function; a pressure sensor is just one possible embodiment of device 12.

Because the embodiment of device 12 illustrated in FIG. 1 is a pressure sensor used in a tire pressure monitoring application, the mass on top must be kept at a minimum in order to limit the mass' acceleration effects on device 12. During operation of a vehicle, any mass overlying the sense diaphragm 17 of device 12 will generate an error in the output of device 12 (e.g. pressure sensor) due to the centrifugal acceleration effects resulting from the tire's rotation. In addition, device 12 may need to function in a corrosive environment (e.g. corrosive chemicals such as water, salt depositing on a road surface, and other typical automotive fluids). In one embodiment, the diaphragm 17 of device 12 includes pressure transducers that sense pressure variations and converts them to electrical signals. Alternate embodiments may function in a different manner.

In FIG. 1, device 12 is attached to package or housing 18 by way of die attach 14. In one embodiment, die attach 14 has adhesive properties which ensure little or no movement of device 12. Wire bonds 16 may be used to electrically couple device 12 to package leads (not shown). This allows external electrical connection to be made to device 12. In one embodiment, package 18 has a cavity or interior chamber 15. The cavity may be any desired shape or size. Device 12 is placed inside cavity 15. Wire bonds 16 may be coupled to electrical leads (not shown) which may protrude through package 18. The components illustrated in FIG. 1 may be made of any appropriate materials.

Figure 2:
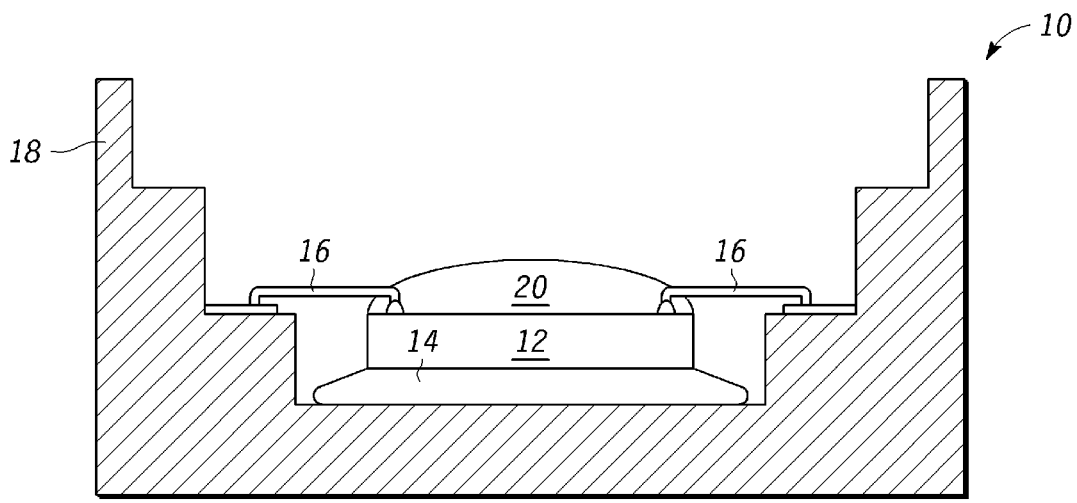

In FIG. 2 a pressure transmitting material 20 is applied overlying device 12. In the illustrated embodiment, pressure transmitting material 20 transmits pressure from a gas or liquid above layer 20 to device 12. In one embodiment, pressure transmitting material 20 is a gel, which for some embodiments may be flexible. In alternate embodiments, pressure transmitting material 20 may be rigid or a film. A wide variety of possible materials exists for pressure transmitting material 20. In one embodiment, pressure transmitting material 20 is a flexible gel that is deposited using a standard syringe and needle dispense apparatus; subsequent curing of the flexible gel may be required. Alternate embodiments may use any desired apparatus and method to apply pressure transmitting material 20 (e.g. physical vapor deposition, spraying, direct placement, etc.). Curing may or may not be required. In addition, in alternate embodiments, pressure transmitting layer 20 may be comprised of one or more layers that are formed of different materials. Thus, pressure transmitting material or layer 20 may be formed from a plurality of layers made of various materials.

Figure 3:
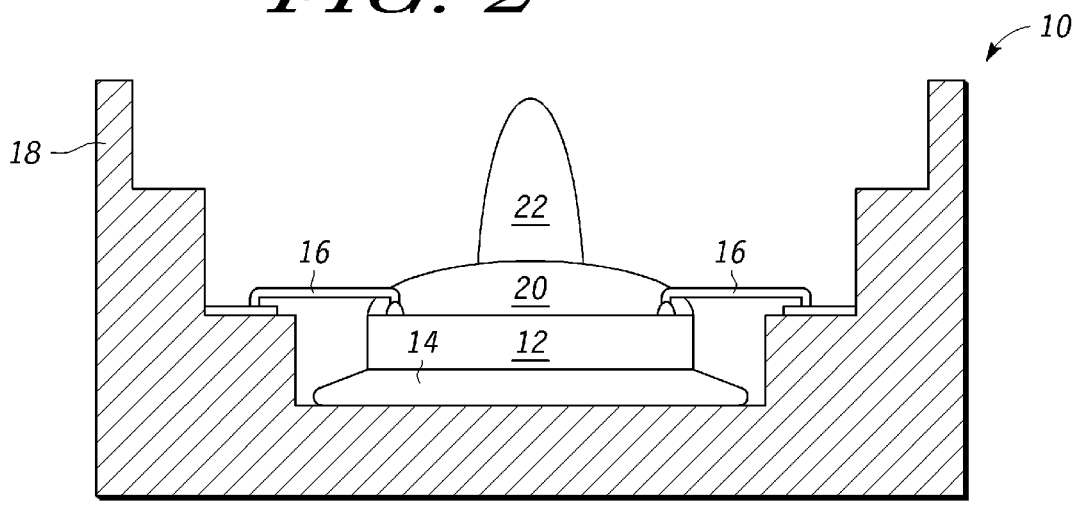

In FIG. 3, a sacrificial material 22 is applied overlying pressure transmitting material 20. In one embodiment, sacrificial material 22 is a gel which requires subsequent curing. In addition, sacrificial material 22 illustrated in FIG. 3 is sufficiently viscous to prevent undue horizontal spreading across the surface of pressure transmitting material 20. In alternate embodiments, sacrificial material 22 may be any material that can allow an encapsulant to be dispensed around it, and yet be removed while allowing the encapsulant to remain. A wide variety of possible materials exists for sacrificial material 22. In one embodiment, sacrificial material 22 is a curable gel that is deposited using a standard syringe and needle dispense apparatus. Alternate embodiments may use any desired apparatus and method to apply sacrificial material 22 (e.g. direct placement, etc.). Note that the shape of sacrificial material 22 may be any shape provided that at least a portion of sacrificial material 22 is placed overlying pressure transmitting material 20. In addition, in alternate embodiments, sacrificial material 22 may be comprises of one or more layers that are formed of different materials. Thus, sacrificial material or layer 22 may be formed from a plurality of layers made of various materials.

Figure 4:
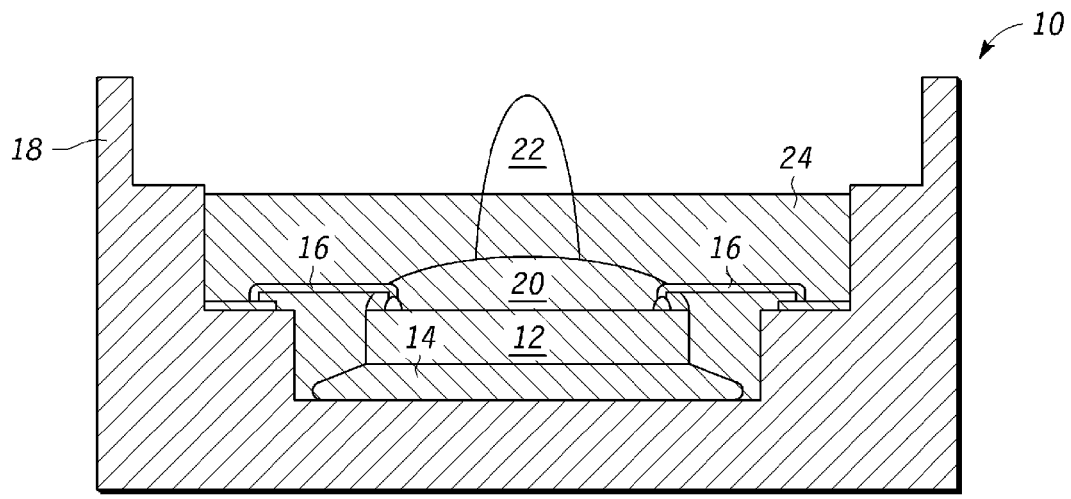

In FIG. 4, an encapsulant or encapsulating material 24 is applied to encapsulate device 12 and any other components that are to be encapsulated (e.g. 14, 16, 20, and the bottom of 22). Alternate embodiments may encapsulate different portions of apparatus 10. In the illustrated embodiment, at least a portion of sacrificial material 22 is left exposed and unencapsulated by encapsulating material 24. The reason for this is to allow a process to be used to remove at least a portion of sacrificial material 22 in subsequent processing. For some embodiments, encapsulating material 24 is a material that requires curing. Alternate embodiments may use an encapsulating material 24 which does not require curing.

In alternate embodiments, it may not be necessary to remove any of sacrificial material 22. For example, if sacrificial material 22 can be used to transmit pressure, it may remain. In such cases sacrificial material 22 is not sacrificial, but serves a masking purpose to prevent encapsulation of a portion of pressure transmitting material 20. Sacrificial layer 22 may also serve a masking purpose even if it is truly sacrificial and subsequently removed. In alternate embodiments, only a portion of sacrificial layer 22 may be removed.

Note that for some embodiments, pressure transmitting material 20 may also serve a dual purpose. In addition to providing protection to device 12 (e.g. from a corrosive environment), pressure transmitting material 20 may also provide stress relief to device 12 from encapsulating material 24.

Figure 5:
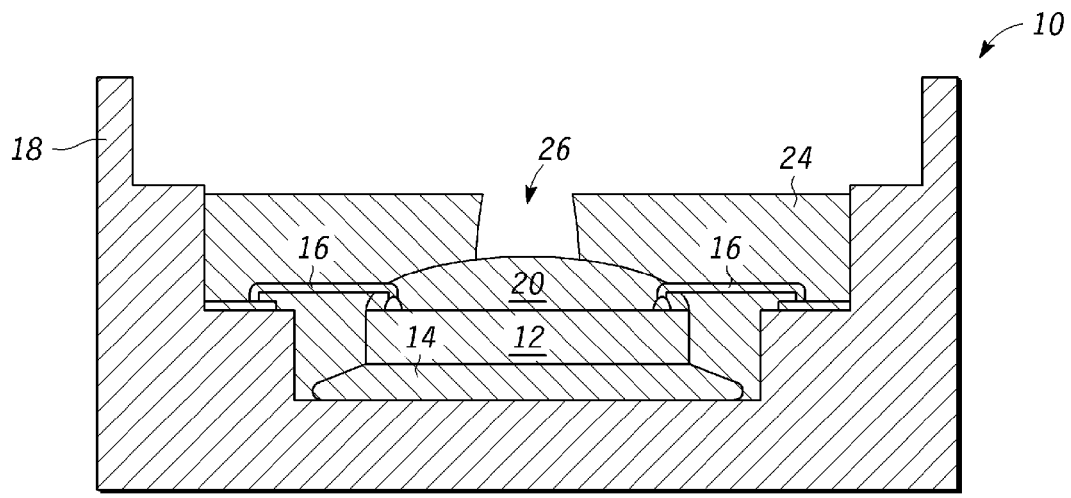

In FIG. 5, sacrificial material 22 is removed. The process used to remove sacrificial material 22 is dependent upon the material used for sacrificial material 22. In one embodiment, sacrificial material 22 is a curable gel that is water soluble and may be removed by rinsing in water. In one embodiment, hot deionized water (e.g. above room temperature) is used to remove sacrificial material 22. Note that this produces an opening 26 in encapsulating material 24 which is above pressure transmitting material 20. In the illustrated embodiment, opening 26 allows the gas or liquid pressure surrounding apparatus 10 to be transmitted to device 12 by way of pressure transmitting material 20.

Note that sensitive circuitry on device 12 and wire bonds 16 are protected from a corrosive environment by pressure transmitting material 20 and encapsulant 24. However, the overlying mass pressing upon the sensing portion of device 12 is kept to a minimum (i.e. a small portion of pressure transmitting material 20). Note that in the illustrated embodiment, the sensing portion of device 12 is located underlying the opening 26.

Figure 6:
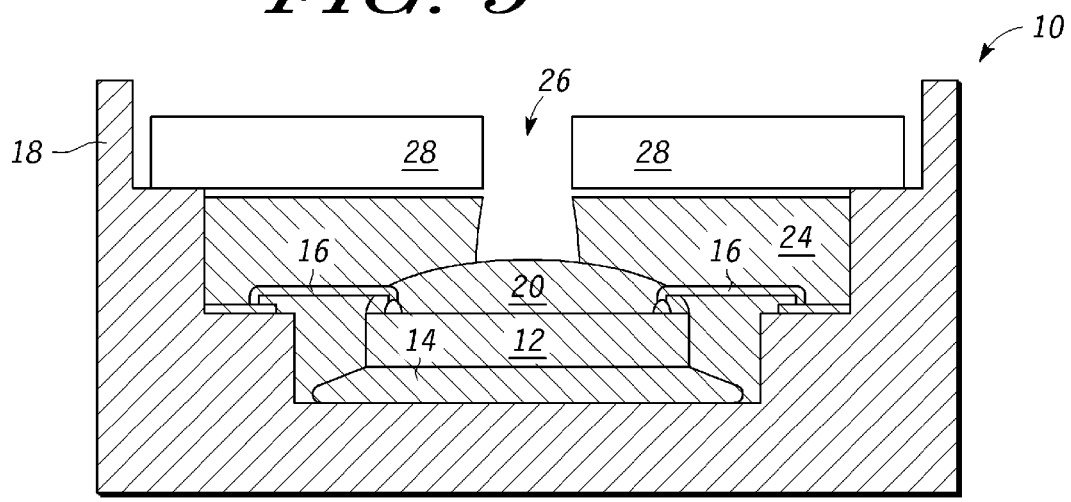

In FIG. 6, an optional cap 28 may be applied overlying some or all of encapsulating material 24. The cap 28 may be used to protect apparatus 10 during handling. Alternate embodiments may not use cap 28. Cap 28 may be formed from any desirable material (e.g. steel, plastic, etc.) and may be applied in any appropriate manner. Note that in one embodiment where device 12 is a pressure sensor, opening 26 may be considered a vent which allows the pressure of a liquid or gas to affect a pressure sensing element of device 12 located underlying vent 26. In one embodiment, apparatus 10 of FIG. 6 illustrates a packaged pressure sensor.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for encapsulating an integrated circuit, comprising:
    applying a pressure transmitting layer overlying a pressure sensitive portion of the integrated circuit;
    applying a sacrificial layer overlying at least a portion of the pressure transmitting layer;
    applying encapsulating material to encapsulating the integrated circuit and the pressure transmitting layer while leaving a portion of the sacrificial layer unencapsulated; and
    removing at least a portion of the sacrificial layer to expose the pressure transmitting layer.

2. A method as in claim 1, wherein said step of removing the sacrificial layer comprises rinsing the sacrificial layer in water.

3. A method as in claim 2, wherein a temperature of the water is above room temperature.

4. A method as in claim 3, wherein the water comprises deionized water.

5. A method as in claim 1, wherein the integrated circuit comprises a pressure sensor.

6. A method as in claim 1, wherein the pressure transmitting layer comprises a gel.

7. A method as in claim 1, wherein said step of applying the pressure transmitting layer comprises curing the pressure transmitting layer.

8. A method for encapsulating a pressure sensor, comprising:
    applying a pressure transmitting material overlying a diaphragm portion of the pressure sensor;
    applying a sacrificial material overlying at least a portion of the pressure transmitting material;
    applying encapsulating material so that a portion of the pressure transmitting material which overlies the diaphragm portion of the pressure sensor is not encapsulated; and
    removing at least a portion of the sacrificial material to expose the pressure transmitting material which overlies the diaphragm portion of the pressure sensor.

9. A method as in claim 8, wherein said step of removing at least a portion of the sacrificial material comprises rinsing the sacrificial material in water.

10. A method as in claim 9, wherein a temperature of the water is above room temperature.

11. A method as in claim 10, wherein the water comprises deionized water.

12. A method as in claim 8, wherein the pressure sensor is protected from direct exposure to gases and liquids by the pressure transmitting material.

13. A method as in claim 8, wherein the pressure transmitting material comprises a gel.

14. A method as in claim 8, wherein said step of applying the pressure transmitting material comprises curing the pressure transmitting material.

* * * * *